May 23, 1961 D. EKLÖV 2,985,842
TRANSISTOR AMPLIFIER
Filed Oct. 18, 1957
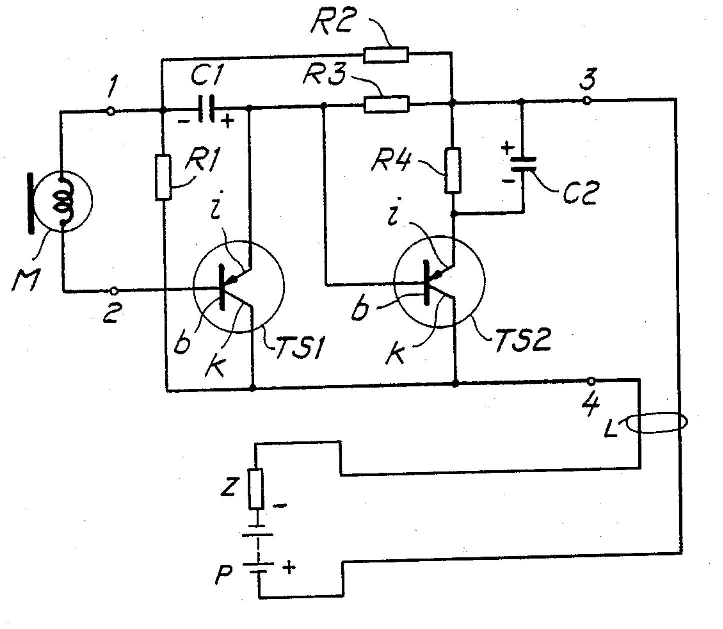
INVENTOR
David Eklöv
BY Strauch, Nolan & Neale
ATTORNEYS United States Patent Office 2,985,842

Patented May 23, 1961

2,985,842

TRANSISTOR AMPLIFIER

David Eklöv, Alvsjo, Sweden, assignor to Svenska Relafabriken ABN AB, Tyuso, Sweden, a corporation of Sweden Filed Oct. 18, 1957, Ser. No. 691,079

Claims priority, application Sweden October 20, 1956

5 Claims. (Cl. 330—19)

The present invention relates to a transistor amplifier. The main object of the invention is to provide a stabilization of the transistors with respect to the effect of temperature variations employing the least possible number of circuit elements.

The invention will be described more in particular in conjunction with the accompanying drawing which shows a circuit diagram of an amplifier embodying the invention.

The amplifier comprises two stages which are equipped with transistors as amplifying elements. The first transitor is designated TS1 and the second transistor TS2. The emitter in each transistor is designated *i*, the base *b* and the collector *k*. The first stage is of the grounded-emitter configuration. The second stage is of the grounded-collector configuration and hence has a high input impedance and a comparatively low output impedance.

The direct current required for the operation of the amplifier is applied to terminals 3 and 4 with the polarity indicated at these terminals on the figure. The emitter of transistor TS1 receives direct current from the terminal 3 over an impedance R3 and is directly connected to the base of the second transistor TS2. The impedance R3 effects temperature compensation of the transistor TS1 and forms together with this transistor a voltage divider from which the base of transistor TS2 obtains its direct voltage. The base of transistor TS1 obtains direct voltage from a tap on a voltage divider formed by resistors R1 and R2 which are connected in series between terminals 3 and 4. The voltage from said tap is applied to the base of transistor TS1 over a microphone M which is connected to the input terminals 1 and 2. The said tap on the voltage divider R1–R2 is connected to the emitter of transistor TS1 over a capacitor C1.

Transistor TS2 is also temperature compensated by means of impedance R4 which is connected between terminal 3 and the emitter of transistor TS2. The impedance R4 is bridged by a capacitor C2 having a high capacity.

The output alternating voltage from the amplifier is taken across the terminals 3 and 4, and hence the two conductors for supplying direct current to the amplifier also serve as output conductors for the output alternating voltage.

The impedance R3 is included as a series impedance in the load circuit for the transistor TS1, and the alternating voltage drop across this impedance is applied as control voltage to the transistor TS2. Impedance R3 can be considered as included in the load circuit of the collector of transistor TS1, since the main alternating voltage drop across transistor TS1 is between the base and the collector, while the voltage drop between the base and the emitter is very small. The collector alternating voltage of the transistor TS2 becomes about equal to the collector alternating voltage of transistor TS1.

The alternating voltage between the emitter and the base of transistor TS2 is also small. Thus transistor TS2 does not cause any voltage amplification but only current amplification. The impedance R3 does not load the transistor TS1 to any appreciable extent and can therefore be given a low value, e.g. of the order of 2000 ohms without consuming any appreciable power, and it is still possible to utilize the high input impedance of transistor TS2.

The impedance R3 can be purely resistive but can also be resistive as well as reactive.

In the amplifier shown on the drawing the transistors are point-contact transistors or junction transistors of the p-n-p-type. However the circuit according to the invention can also be used with junction transistors of the n-p-n-type, but in such case the polarity of the direct current applied to the amplifier must be opposite to that shown on the drawing.

In the circuit according to the invention a less number of components (resistors and capacitors) is required than in hitherto known transistor amplifiers with temperature compensation. The amplifier according to the invention can be made in a compact unit which requires very little space.

The proper values of resistances and capacitances in the transistor amplifier according to the invention will of course to some extent be dependent on the characteristics of the used transistors. In a practical embodiment of the amplifier shown on the drawing the following values were used: R1=68,000 ohms, R2=33,000 ohms, R3=2200 ohms, R4=330 ohms, C1=10 microfarads, C2=32 microfarads. These values are given by way of example only and do not limit in any way the scope of the invention.

The amplifier according to the invention is particularly suited for use as a pre-amplifier directly connected to the microphone in such loud-speaking systems and the like wherein the microphone is connected to the power amplifier by means of a long line. This line need not contain more than two conductors, since the direct voltage can be applied to the transistor amplifier over the same conductors as serve as output conductors for the output alternating voltage.

What I claim is:

1. A transistor amplifier comprising a first transistor and a second transistor each having a base, an emitter and a collector, a first and a second terminal for connecting the amplifier to a direct current source for supplying D.C. power required for the operation of both transistors, said first and second terminals also serving as signal output terminals for the amplifier, a voltage divider connected between said first and second terminals, the base of the first transistor being connected for direct current to a tap on said voltage divider, means connecting an input signal source directly between the base and emitter of the first transistor, a stabilizing impedance containing a D.C. conductive path connected between said first terminal and the emitter of the first transistor, said first terminal being connected to the emitter of the second transistor, said second terminal being connected to the collector of both transistors, and the emitter of the first transistor being connected directly to the base of the second transistor.

2. The transistor amplifier as defined in claim 1 wherein the value of the D.C. resistance of the stabilizing impedance is of the order of 2000 ohms.

3. A transistor amplifier comprising a first transistor and a second transistor each having a base, an emitter and collector, a first and a second terminal for connecting the amplifier to a direct current source for supplying D.C. power required for the operation of both transistors, said first and second terminals also serving as signal output terminals for the amplifier, a first stabilizing impedance containing a D.C. conductive path connected between said first terminal and the emitter of the first transistor, a second stabilizing impedance containing a D.C. conductive path connected between said first terminal and the emitter of the second transistor, a voltage divider connected between said first and second terminals, the base of the first transistor being connected for direct current to a tap on said voltage divider, means connecting an input signal source directly between the base and emitter of the first transistor, the emitter of the first transistor being connected directly to the base of the second transistor, and the collectors of both transistors being connected to said second terminal.

4. A transistor amplifier comprising a first transistor and a second transistor each having a base, an emitter and a collector, a signal generating device and a capacitor connected in series between the base and the emitter of the first transistor, a first and a second terminal for connecting the amplifier to a direct current source for applying D.C. power required for the operation of both transistors, said first and second terminals also serving as signal output terminals for the amplifier, a first stabilizing impedance containing a D.C. conductive path connected between said first terminal and the emitter of the first transistor, a second stabilizing impedance containing a D.C. conductive path connected between said first terminal and the emitter of the second transistor, a voltage divider connected between said first and second terminals, a tap on said voltage divider being connected to the junction of said signal generating device and said capacitor, and the emitter of the first transistor being connected directly to the base of the second transistor, and the collector of both transistors being connected to said second terminal.

5. The transistor amplifier as defined in claim 4 wherein the value of the D.C. resistance of the first stabilizing impedance is of the order of 2000 ohms.

References Cited in the file of this patent

UNITED STATES PATENTS

| | | |
|---|---|---|
| 2,663,806 | Darlington | Dec. 22, 1953 |
| 2,750,456 | Waldhauer | June 12, 1956 |
| 2,762,873 | Goodrich | Sept. 11, 1956 |
| 2,808,471 | Poucel et al. | Oct. 1, 1957 |
| 2,858,379 | Stanley | Oct. 28, 1958 |